(12) United States Patent
Lu

(10) Patent No.: US 7,987,595 B2
(45) Date of Patent: Aug. 2, 2011

(54) METHOD FOR MAKING A PROBE CARD

(76) Inventor: Wen-Yu Lu, Tainan County (TW)

( * ) Notice: Subject to any disclaimer, the term of this patent is extended or adjusted under 35 U.S.C. 154(b) by 608 days.

(21) Appl. No.: 12/119,873

(22) Filed: May 13, 2008

(65) Prior Publication Data

US 2008/0209719 A1    Sep. 4, 2008

Related U.S. Application Data

(63) Continuation-in-part of application No. 11/311,179, filed on Dec. 20, 2005, now abandoned.

(51) Int. Cl.
*H01R 43/00* (2006.01)

(52) U.S. Cl. ........... 29/884; 29/831; 29/885; 324/755.1; 438/652

(58) Field of Classification Search ............ 29/825, 29/830, 831, 842, 874, 876, 884, 885; 205/122, 205/135; 324/754.07, 755.01, 756.03, 756.07; 438/652
See application file for complete search history.

(56) References Cited

U.S. PATENT DOCUMENTS

| | | | | |
|---|---|---|---|---|
| 5,055,778 A * | 10/1991 | Okubo et al. | ............ | 324/756.03 |
| 5,378,971 A * | 1/1995 | Yamashita | ............... | 324/755.01 |
| 6,710,608 B2 * | 3/2004 | Yoshida et al. | ........... | 324/754.07 |
| 6,956,386 B2 * | 10/2005 | Kim et al. | ................ | 324/756.07 |

FOREIGN PATENT DOCUMENTS

TW    I275801    3/2007

\* cited by examiner

*Primary Examiner* — Donghai D. Nguyen
(74) *Attorney, Agent, or Firm* — Ostrolenk Faber LLP

(57) ABSTRACT

A method for making a probe card includes: mounting a plurality of probe needles on a probe-mounting seat; forming a conductive protective coating on tips of the probe needles; and bonding the probe needles to a printed circuit board through welding techniques after formation of the conductive protective coating on the tips of the probe needles.

5 Claims, 9 Drawing Sheets

METHOD FOR MAKING A PROBE CARD

CROSS-REFERENCE TO RELATED APPLICATION

This application is a continuation-in-part (CIP) of U.S. patent application Ser. No. 11/311,179, filed on Dec. 20, 2005, now abandoned.

BACKGROUND OF THE INVENTION

1. Field of the Invention

This invention relates to a method for making a probe card, more particularly to a method involving forming a conductive protective coating on tips of probe needles.

2. Description of the Related Art

FIG. 1 illustrates a conventional probe card 1 that usually includes a printed circuit board 11, a mounting seat 12 provided on the printed circuit board 11, and a plurality of probe needles 13 mounted on the mounting seat 12 and welded to the printed circuit board 11. In operation, the probe needles 13 made of a conductive material contact a surface of a wafer 14 for testing functionality of integrated circuits of the wafer 14. However, particles and contaminants resulting from processing of the wafer 14 may attach to the probe needles 13, which results in damage to the probe needles 13 after a period of use. A protective coating formed on the probe needles 13 has been proposed for protection of the probe needles 13.

Taiwanese patent no. 275801 discloses a method for forming the protective coating on the probe needles mounted on the printed circuit card of a probe card. In the method, a shield is required to cover portions of the probe card, including the printed circuit board, the mounting seat, and portions of the probe needles, to expose solely the tips of the probe needles on which the protective coating is to be formed. However, the covering operation is expensive and inefficient.

SUMMARY OF THE INVENTION

Therefore, an object of the present invention is to provide a method for making a probe card that is more efficient than the prior art.

According to the present invention, a method for making a probe card comprises: mounting a plurality of probe needles on a probe-mounting seat; forming a conductive protective coating on tips of the probe needles; and bonding the probe needles to a printed circuit board through welding techniques after formation of the conductive protective coating on the tips of the probe needles.

BRIEF DESCRIPTION OF THE DRAWINGS

Other features and advantages of the present invention will become apparent in the following detailed description of the preferred embodiment of this invention, with reference to the accompanying drawings, in which.

DETAILED DESCRIPTION OF THE PREFERRED EMBODIMENT

Figure 1:
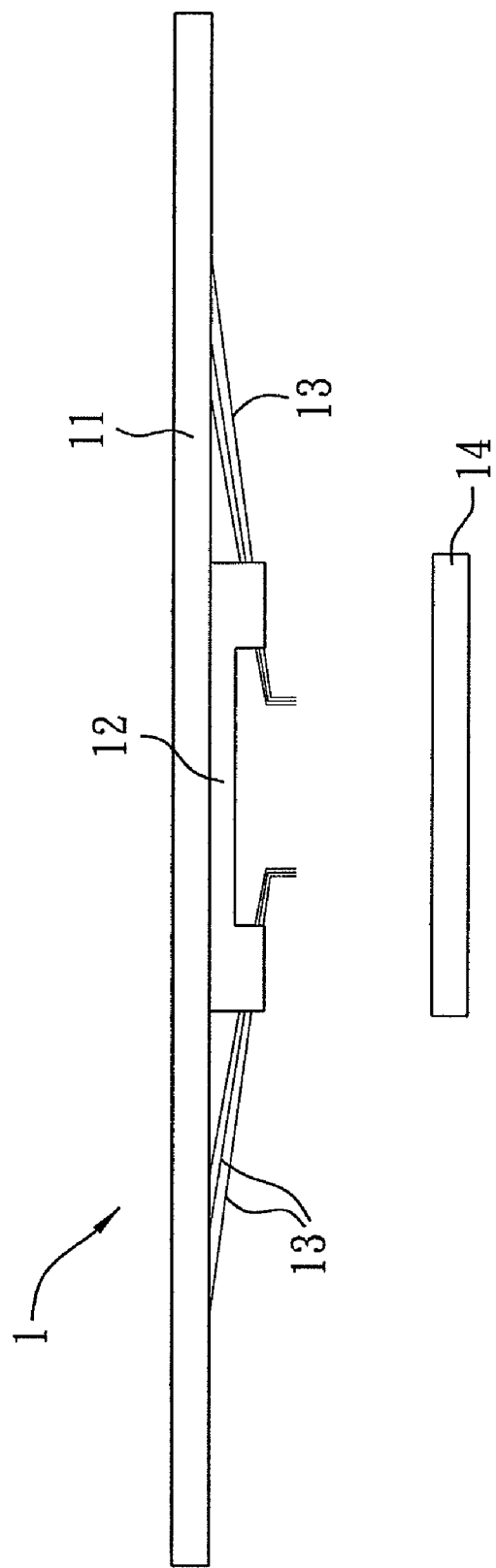
FIG. 1 is a schematic view of a conventional probe card.
Figure 2:
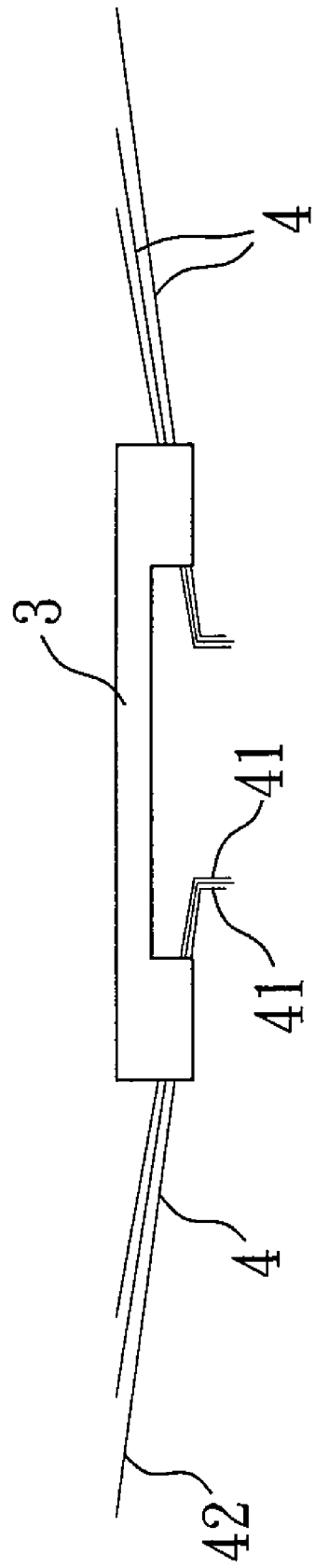
FIGS. 2 to 9 are views to illustrate consecutive steps of the preferred embodiment of a method for making the probe card according to this invention.
Figure 3:
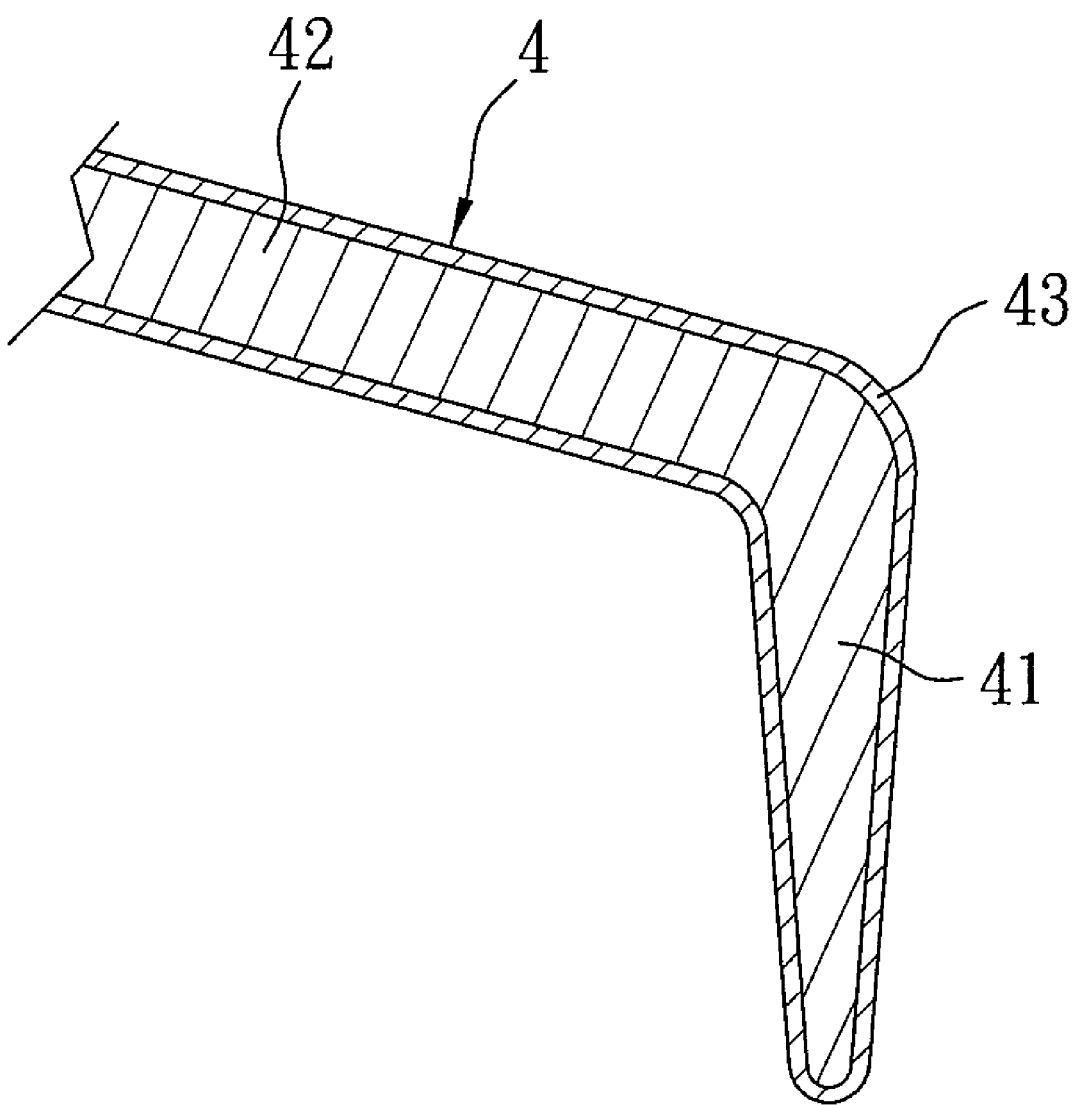
Figure 4:
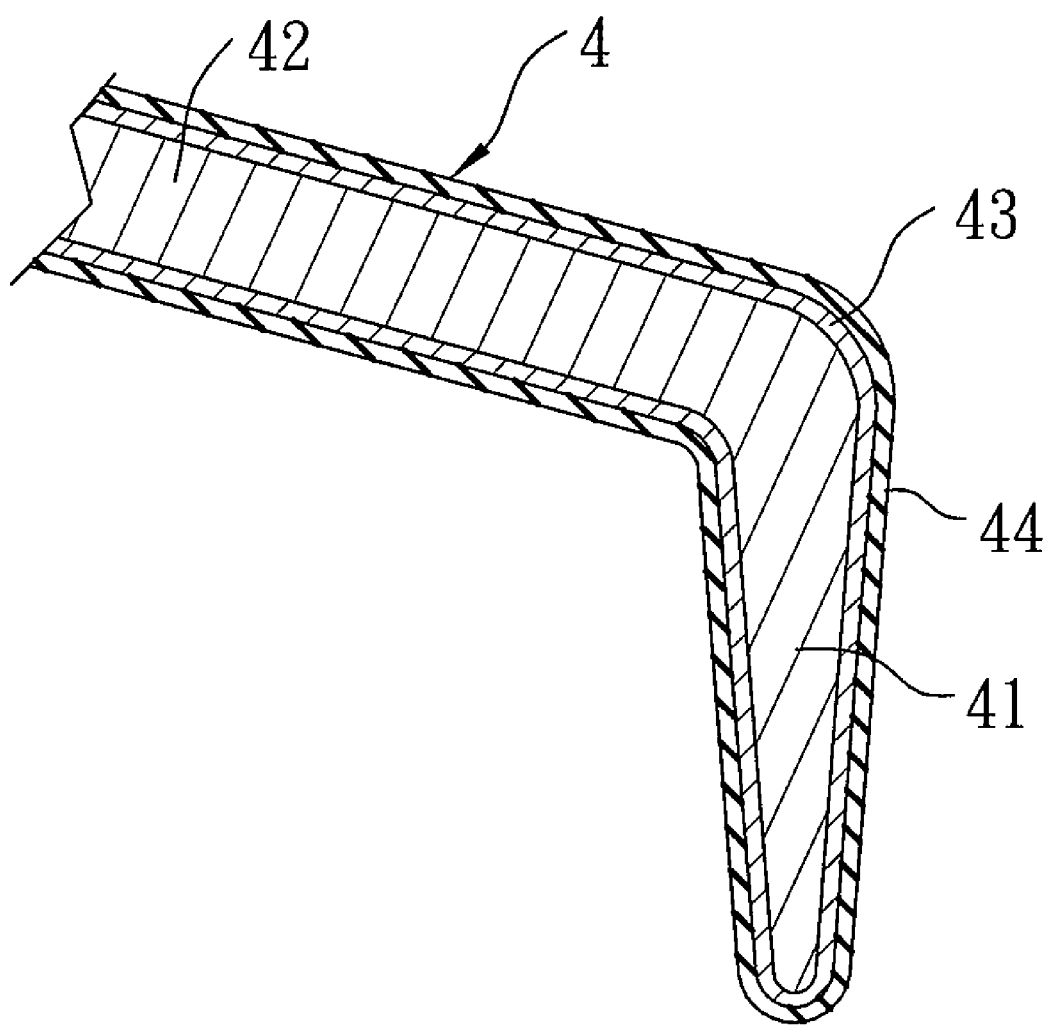
Figure 5:
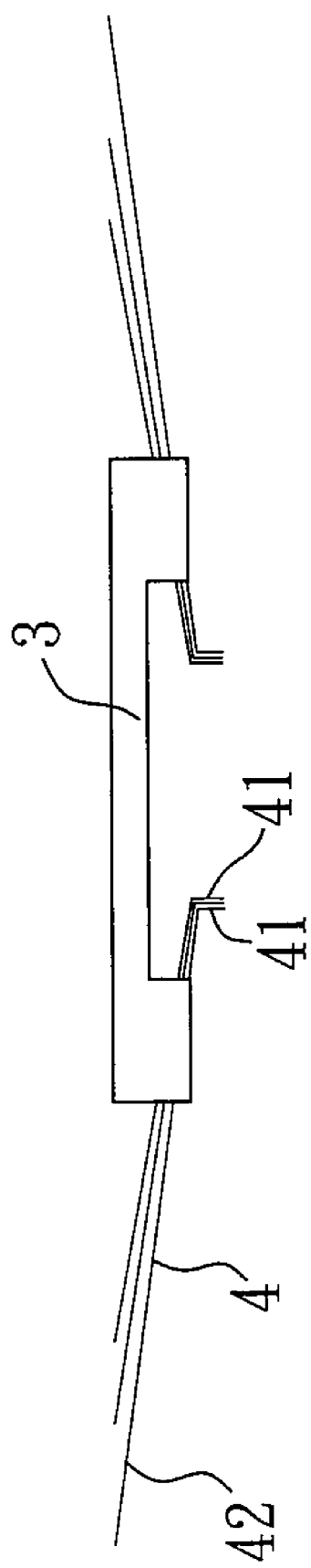
Figure 6:
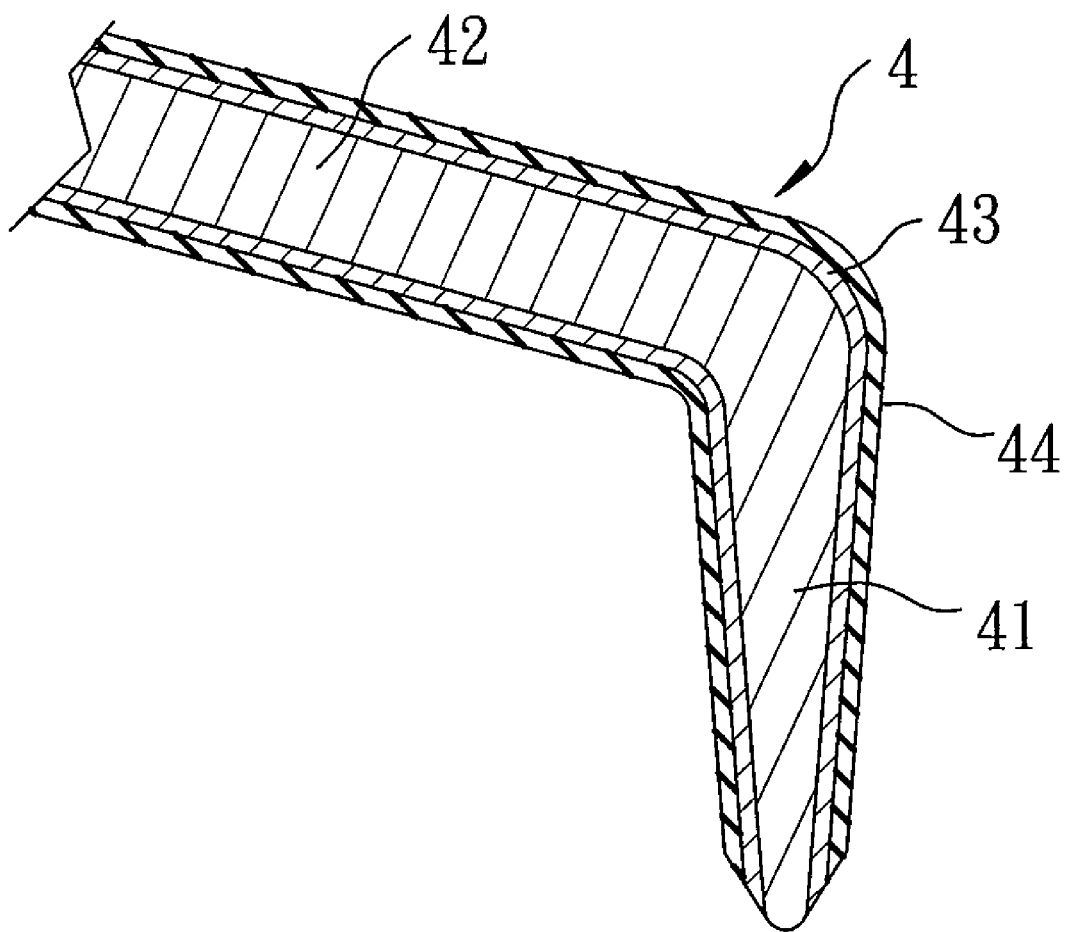
Figure 7:
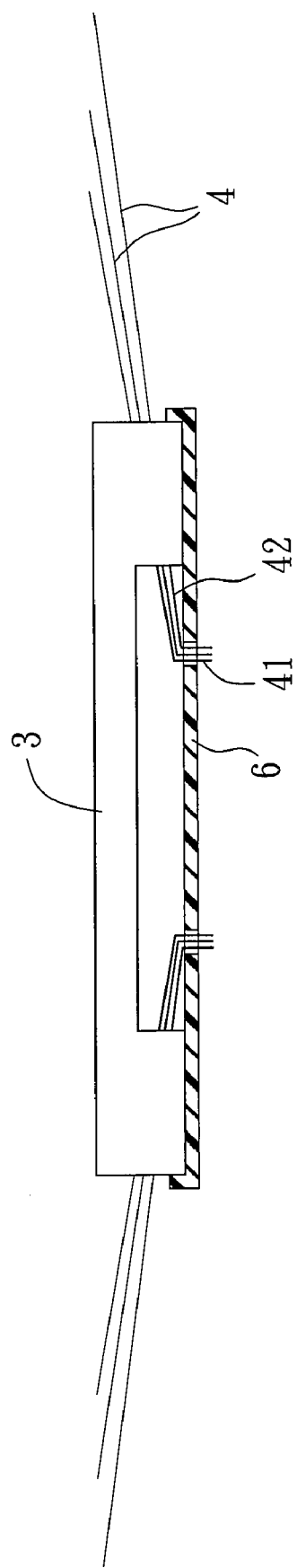
Figure 8:
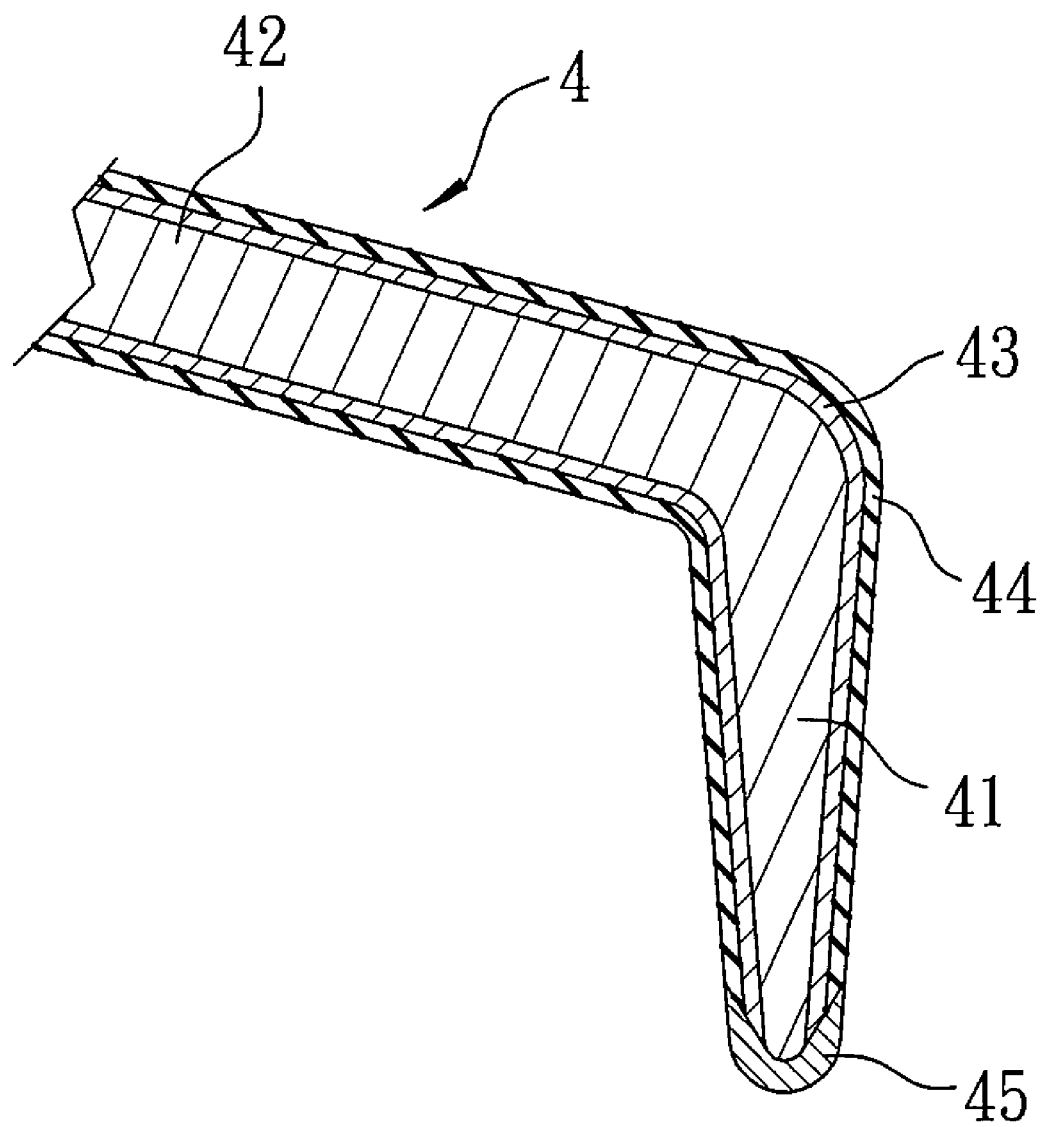
Figure 9:
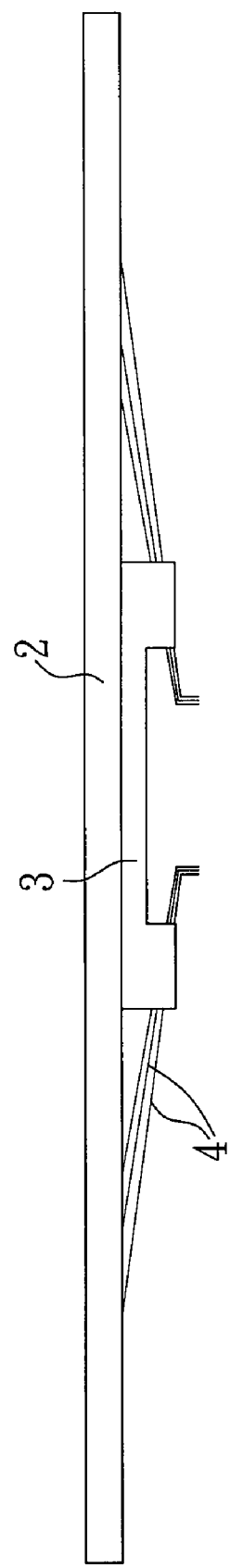

FIGS. 2 to 9 illustrate consecutive steps of the preferred embodiment of a method for making a probe card according to this invention.

The method for making the probe card includes the steps of: mounting a plurality of probe needles 4 on a probe-mounting seat 3 (see FIG. 2); forming a conductive protective coating 45 on a tip of a test segment 41 of each of the probe needles 4 (see FIG. 8) so as to prevent the test segment 41 from directly contacting a test object (not shown); and bonding a connecting segment 42 of each of the probe needles 4 to a printed circuit board 2 (see FIG. 9) through welding techniques after formation of the conductive protective coating 45 on the tips of the probe needles 4.

In this embodiment, the method further includes forming a conductive layer 43 on the probe needles 4 (see FIG. 3), and then forming an insulator layer 44 on the conductive layer 43 (see FIG. 4), which prevents electromagnetic interferences among the probe needles 4, prior to formation of the conductive protective coating 45 on the tips of the probe needles 4.

The method further includes grinding the tips of the probe needles 4 such that the tips of the probe needles 4 lie on the same plane (see FIG. 5) prior to formation of the conductive protective coating 45 on the tips of the probe needles 4, thereby minimizing damage to the conductive protective coating 45 after the latter is formed, and enhancing performance of the probe needles 4. Alternatively, grinding the probe needles 4 can be performed prior to mounting of the probe needles 4 on the probe-mounting seat 3.

It is noted that the conductive layer 43 and the insulator layer 44 may be removed from the tips of the probe needles 4 when grinding the probe needles 4.

After the grinding operation, the tip of each of the probe needles 4 is tapered (see FIG. 6) so that after the tip of each of the probe needles 4 is coated with the conductive protective coating 45, contact between the tips of the probe needles 4 and a test object, i.e., a surface of a test wafer, can be facilitated.

Preferably, a shield 6 is used to cover the connecting segment 42 of each of the probe needles 4 and the probe-mounting seat 3 (see FIG. 7) prior to formation of the conductive protective coating 45 on the tips of the probe needles 4 (see FIG. 8) when formation of the conductive protective coating 45 is conducted through one of sputtering and evaporating techniques. Alternatively, formation of the conductive protective coating 45 on the tips of the probe needles 4 can be conducted without the use of the shield 6. In this situation, formation of the conductive protective coating 45 is conducted through electroplating techniques such that the probe-mounting seat 3 is formed with the conductive protective coating 45 thereon and removal of the conductive protective coating 45 on the connecting segment 42 of each of the probe needles 4 and the probe-mounting seat 3 is required subsequently.

Preferably, the conductive protective coating 45 is made from a material that does not permit particles and contaminants to easily attach thereto.

Preferably, formation of the conductive layer 43 is conducted through one of sputtering, evaporating and electroplating techniques.

By forming the conductive protective coating 45 on the tips of the probe needles 4 prior to bonding to the printed circuit board 2, the aforesaid drawback associated with the prior art can be eliminated.

With the invention thus explained, it is apparent that various modifications and variations can be made without departing from the spirit of the present invention. It is therefore intended that the invention be limited only as recited in the appended claims.

What is claimed is:

1. A method for making a probe card comprising:

mounting a plurality of probe needles on a probe-mounting seat;

forming a conductive protective coating on tips of the probe needles; and bonding the probe needles to a printed circuit board through welding techniques after formation of the conductive protective coating on the tips of the probe needles, prior to formation of the conductive protective coating of the tips of the probe needles, forming an insulator layer on the robe needles;

prior to formation of the conductive protective coating of the tips of the probe needles, grinding the tips of the probe needles such that the tips of the probe needles lie on the same plane; and covering the probe-mounting seat using a shield prior to formation of the conductive protective coating on the tips of the probe needles.

2. The method of claim 1, further comprising forming a conductive layer on the probe needles prior to formation of the insulator layer.

3. The method of claim 1, wherein formation of the conductive protective coating on the tips of the probe needles is conducted through one of sputtering and evaporating techniques.

4. A method for making a probe card comprising:

mounting a plurality of probe needles on a probe-mounting seat;

forming a conductive protective coating on tips of the robe needles; and bonding the probe needles to a printed circuit board through welding techniques after formation of the conductive protective coating on the tips of the probe needles, prior to the formation of the conductive protective coating of the tips of the probe needles, forming an insulator layer on the probe needles, prior to the formation of the conductive protective coating of the tips of the probe needles, grinding the tips of the probe needles such that the tips of the probe needles lie on the same plane, and wherein formation of the conductive protective coating on the tips of the probe needles is conducted through electroplating such that the probe-mounting seat is formed with the conductive protective coating thereon.

5. The method of claim 4, further comprising removing the conductive protective coating from the probe-mounting seat.

* * * * *